(12) United States Patent
Lee et al.

(10) Patent No.: US 11,239,805 B2
(45) Date of Patent: Feb. 1, 2022

(54) DIFFERENTIAL OPTO ISOLATOR

(71) Applicant: Analog Devices, Inc., Norwood, MA (US)

(72) Inventors: Check F. Lee, Bedford, MA (US); Baoxing Chen, Westford, MA (US)

(73) Assignee: Analog Devices, Inc., Wilmington, MA (US)

( * ) Notice: Subject to any disclaimer, the term of this patent is extended or adjusted under 35 U.S.C. 154(b) by 221 days.

(21) Appl. No.: 16/155,556

(22) Filed: Oct. 9, 2018

(65) Prior Publication Data

US 2020/0112291 A1 Apr. 9, 2020

(51) Int. Cl.
*G02B 27/00* (2006.01)
*H03F 3/45* (2006.01)
*H01L 31/12* (2006.01)

(52) U.S. Cl.
CPC .............. *H03F 3/45* (2013.01); *H01L 31/12* (2013.01)

(58) Field of Classification Search
CPC ................................. H03F 3/45; G11C 7/062
USPC ........................................................ 250/551
See application file for complete search history.

(56) References Cited

U.S. PATENT DOCUMENTS

| | | | |
|---|---|---|---|
| 3,772,514 A | 11/1973 | Sunderland | |
| 6,198,118 B1* | 3/2001 | Holcombe | H01L 31/02005 257/292 |
| 6,265,724 B1 | 7/2001 | Miettinen | |
| 8,410,464 B2 | 4/2013 | Omura | |
| 8,791,442 B2* | 7/2014 | Hidaka | H03F 1/083 250/214 R |
| 9,012,826 B2 | 4/2015 | Wong et al. | |
| 2004/0173729 A1* | 9/2004 | Shimizu | H03F 3/45475 250/214 R |
| 2007/0158663 A1* | 7/2007 | Holcombe | H01L 25/167 257/82 |
| 2014/0119739 A1* | 5/2014 | Maasi | H04B 1/587 398/158 |
| 2015/0333841 A1* | 11/2015 | Imai | H03F 3/085 250/551 |
| 2016/0294385 A1* | 10/2016 | Vazach | H03K 17/78 |
| 2017/0075081 A1* | 3/2017 | Luk | G01J 1/44 |
| 2017/0098635 A1* | 4/2017 | Chen | H01L 25/167 |

OTHER PUBLICATIONS

[No Author Listed], ACPL-077L Low-Power 3.3V/5V Data Sheet. High-Speed CMOS Optocoupler Design for System-Level Reliability. Broadcom. Jan. 12, 2018;10 pages.

(Continued)

*Primary Examiner* — Georgia Y Epps
*Assistant Examiner* — Kevin Wyatt
(74) *Attorney, Agent, or Firm* — Wolf, Greenfield & Sacks, P.C.

(57) ABSTRACT

Isolators and methods for operating the same are described for opto-isolators with improved common mode transient immunity (CMTI). In some embodiments, a pair of photodetectors are provided in the opto-isolator and configured to generate photocurrents of opposite signs or directions in response to a light signal. Photocurrents from the pair of photodetectors are combined in a differential manner to represent data transmitted in a light signal, while common mode transient noise at the two photodetectors is attenuated or eliminated.

20 Claims, 10 Drawing Sheets

(56) References Cited

OTHER PUBLICATIONS

[No Author Listed], Agilent Technologies. Optocoupler Designer's Guide. Mar. 2, 2004;70 pages.

[No Author Listed], HCPL-2530, HCPL-2531, HCPL-4534, HCPL-0530, HCPL-0531, HCPL-0534 Data Sheet. Dual Channel, High Speed Optocouplers. Avago Technologies. Jun. 19, 2007;15 pages.

[No Author Listed], HCPL-2602, HCPL-2612 Data Sheet. High CMR Line Receiver Optocouplers. Avago Technologies. Jul. 18, 2007; 17 pages.

[No Author Listed], HCPL-540x, 5962-89570, HCPL-543x, HCPL-643x, 5962-89571 Data Sheet. Hermetically Sealed, Very High Speed, Logic Gate Optocouplers. Broadcom. Oct. 2, 2017; 16 pages.

[No Author Listed], IL420/IL4208 Data Sheet. Vishay Semiconductors. Optocoupler, Phototriac Output, High dV/dt, Low Input Current. Vishay. Apr. 26, 2004; 7 pages.

* cited by examiner

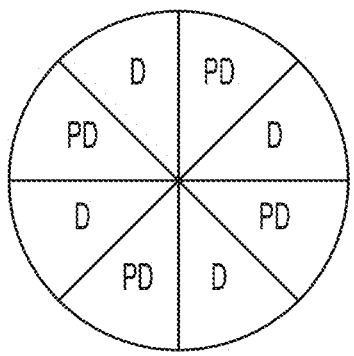
FIG. 9A
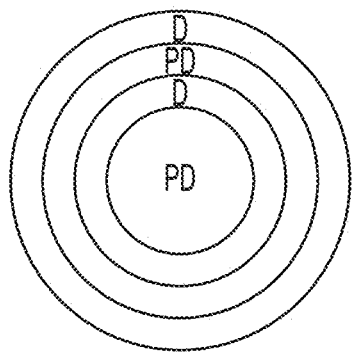
FIG. 9B
FIG. 9C
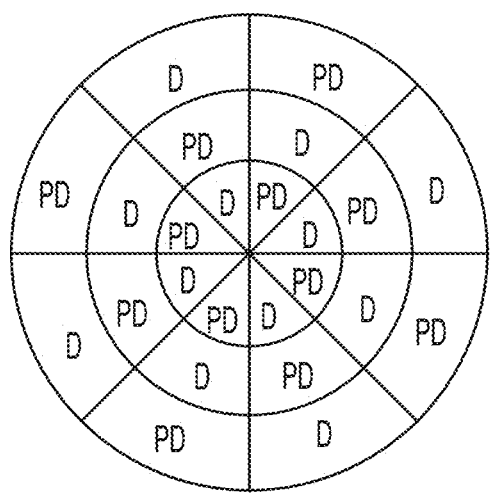
FIG. 9D

DIFFERENTIAL OPTO ISOLATOR

FIELD OF THE DISCLOSURE

The present application relates to an opto-isolator.

BACKGROUND

Galvanic isolation between circuit components and transmission of data and power across an isolation barrier is often provided for safety and/or data integrity considerations. Opto-isolators, also known as opto-couplers, are a type of isolator device that can provide galvanic isolation for data transmission.

Some opto-isolators include an input side with a light source, and an output side with a photodetector that is galvanically isolated from the input side and configured to generate a photocurrent in response to a light signal from the light source. The galvanic isolation between the input side and output side of the opto-isolator may be referred to as an isolation barrier.

SUMMARY OF THE DISCLOSURE

Isolators and methods for operating the same are described for opto-isolators with improved common mode transient immunity (CMTI). In some embodiments, a pair of photodetectors are provided in the opto-isolator and configured to generate photocurrents of opposite signs or directions in response to a light signal. Photocurrents from the pair of photodetectors are combined in a differential manner to represent data transmitted in a light signal, while common mode transient noise at the two photodetectors is attenuated or eliminated.

In some embodiments, an isolator is provided. The isolator comprises an input terminal and an output terminal electrically isolated from the input terminal; a light source coupled to the input terminal and configured to transmit a light signal representing an input electric signal at the input terminal; a first photodetector coupled between a first node and a second node; a second photodetector coupled between a third node and a fourth node. The first photodetector is configured to receive the light signal and generate a first photocurrent from the first node toward the second node in response to the light signal. The second photodetector is configured to receive the light signal and generate a second photocurrent from the third node toward the fourth node in response to the light signal. The isolator further comprises a differential amplifier circuitry coupled to the second node, the third node and the output terminal. The differential amplifier circuitry is configured to generate an output electric signal at the output terminal based on a difference between the first photocurrent and the second photocurrent.

In some embodiments, a semiconductor package is provided. The semiconductor package comprises a semiconductor substrate comprising a first photodetector and a second photodetector disposed on a first surface of the substrate; an input terminal and an output terminal electrically isolated from the input terminal; a light source coupled to the input terminal and configured to transmit a light signal representing an input electric signal at the input terminal. The first photodetector is coupled between a first node and a second node, and is configured to receive the light signal and generate a first photocurrent from the first node toward the second node in response to the light signal. The second photodetector is coupled between a third node and a fourth node, and configured to receive the light signal and generate a second photocurrent from the third node toward the fourth node in response to the light signal. The semiconductor package further comprises a differential amplifier circuitry coupled to the second node, the third node and the output terminal. The differential amplifier is configured to generate an output electric signal at the output terminal based on a difference between the first photocurrent and the second photocurrent.

In some embodiments, a method for operating an isolator is provided. The isolator has an input terminal and an output terminal electrically isolated from the input terminal. The method comprises providing an input electric signal at the input terminal; transmitting, by a light source coupled to the input terminal, a light signal representing the input electric signal; receiving the light signal at a first photodetector coupled between a first node and a second node; generating, by the first photodetector, a first photocurrent from the first node toward the second node in response to the received light signal; receiving the light signal at a second photodetector coupled between a third node and a fourth node; generating, by the second photodetector, a second photocurrent from the third node toward the fourth node in response to the received light signal; generating, by a differential amplifier circuitry coupled to the second node, the third node and the output terminal, an output electric signal at the output terminal based on a difference between the first photocurrent and the second photocurrent.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear. In the drawings:

FIG. 9A is a schematic top view diagram of an exemplary detector unit 900A representing a non-limiting implementation of the detector unit 120 of FIG. 1, according to some embodiments of the present application;

FIG. 9B is a schematic top view diagram of an exemplary detector unit 900B representing a non-limiting implementation of the detector unit 120 of FIG. 1, according to some embodiments of the present application;

FIG. 9C is a schematic top view diagram of an exemplary detector unit 900C representing a non-limiting implementation of the detector unit 120 of FIG. 1, according to some embodiments of the present application;

FIG. 9D is a schematic top view diagram of an exemplary detector unit 900D representing a non-limiting implementation of the detector unit 120 of FIG. 1, according to some embodiments of the present application.

DETAILED DESCRIPTION

Figure 1:
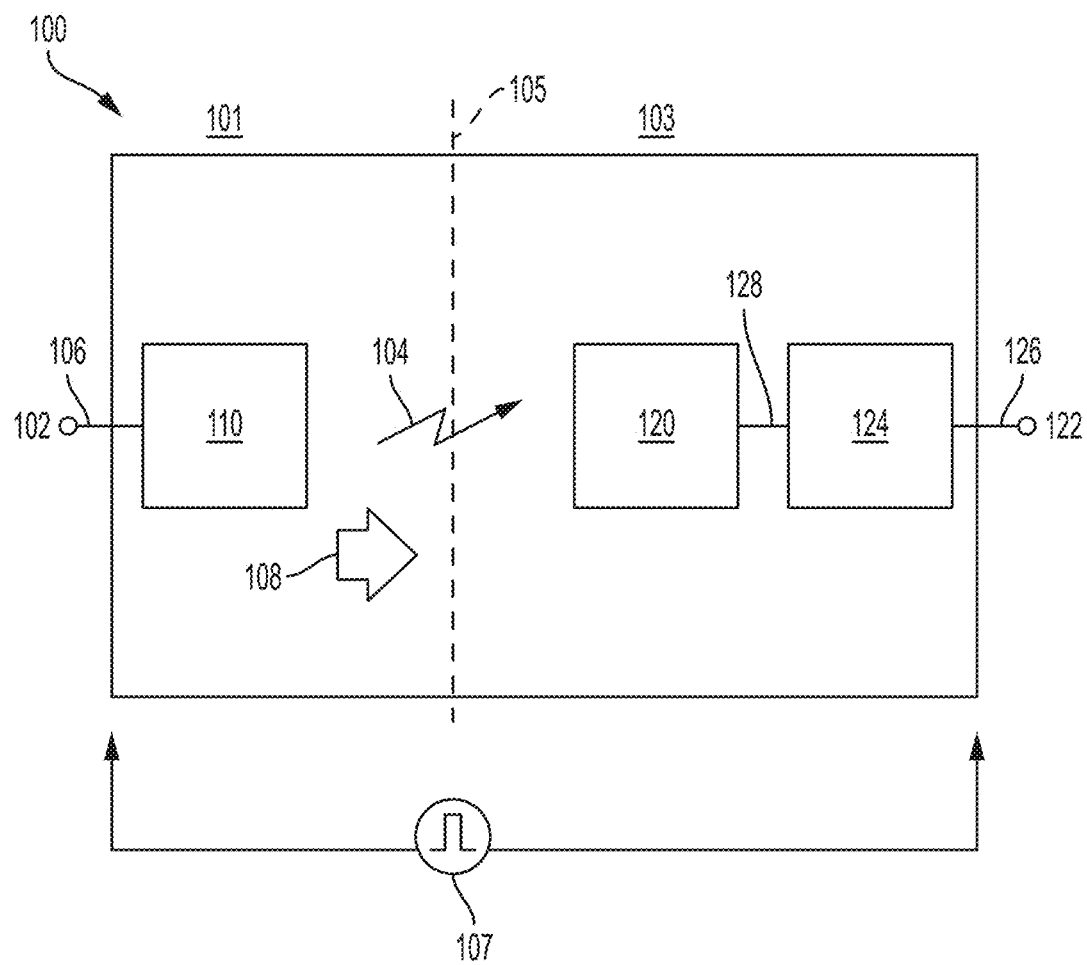
FIG. 1 is a high level block diagram of an opto-isolator 100, according to some embodiments of the present application.

Aspects of the present application are directed to an opto-isolator that provides galvanic or electrical isolation between an input electrical signal at an input side and an output electric signal at an output side. The opto-isolator includes a light source in the input side that generates a light signal based on the input electrical signal, and two photodetectors at the output side configured to generate photocurrents of opposite signs or directions in response to the light signal. Photocurrents from the two photodetectors are combined differentially in the opto-isolator to generate the output electric signal, such that common mode transient electrical noise between the input side and output side may be rejected or attenuated in the output electrical signal.

The inventor has recognized and appreciated that in an opto-isolator, common mode transient (CMT) may arise when there is a transient voltage across the isolation barrier, which due to capacitive coupling across the isolation barrier would be picked up in the output side as a transient current. This transient current can lead to undesirable output signals that are also known as electrical common mode transient noise even in the absence of a light signal at the light source and a photocurrent at the photodetector. Common mode transient immunity (CMTI) is a metric used to describe the maximum CMT gradient an isolator system can withstand without erroneous output. CMTI performance of an opto-isolator is limited by the parasitic capacitance between the light source and the photodetector, especially in opto-isolators where light sources such as light-emitting diodes (LEDs) and photodetectors are fabricated within a single package. The inventor has recognized and appreciated that one way to improve CMTI in an opto-isolator is to provide a pair of photodetectors configured to generate photocurrents of opposite signs or directions in response to a light signal, and to combine the photocurrents in a differential manner. Because the photodetectors are located in the same output side of the opto-isolator, in the event of CMT, transient current is induced in each photodetector based on capacitive couplings between one or more components at the input side and the photodetector, or in the case where one or more shields are present between the input side and the output side, capacitive couplings between a shield and the photodetector. The induced transient current in each photodetector may be of the same sign or direction. The transient currents, when combined differentially, are attenuated or eliminated if the transient currents are similar in magnitude, for example from two photodetectors that have similar capacitive coupling to the input side. On the other hand, light signals emitted from the light source may cause a photocurrent to be generated in each of the pair of photodetectors. The two photocurrents may be generated to have opposite signs or directions by the respective photodetectors, which when combined differentially represent a signal that is indicative of the light signal. In this way, aspects of the present application allow for an opto-isolator with improved CMTI.

According to an aspect of the present application, the input side of the opto-isolator includes an input terminal, and a light source coupled to the input terminal for transmitting a light signal representing the input electric signal at the input terminal. The output side includes an output terminal, and two photodetectors configured to each generate photocurrents that are substantially 180° out of phase from each other, or of opposite signs or directions relative to a common reference direction in response to the light signal. The opto-isolator includes a differential amplifier configured to combine the two photocurrents from the respective two photodetectors and to generate an output electric signal at the output terminal based on a difference between the two photocurrents.

FIG. 1 is a high level block diagram of an opto-isolator 100, according to some embodiments of the present application. The opto-isolator 100 comprises an input terminal 102 in an input side 101, and an output terminal 122 in an output side 103. The input side 101 and output side 103 are separated by an isolation barrier 105. A light source 110 is in the input side 101 and configured to transmit a light signal 104. A detector unit 120 is in the output side 103 and is coupled to amplifier 124. A transient voltage 107 may be applied across the isolation barrier 105 and is related to a common mode transient displacement current 108.

In the opto-isolator 100 as shown in FIG. 1, light source 110 is coupled to input terminal 102 and is configured to receive an input electric signal 106 at the input terminal 102. Light source 110 is then configured to generate light signal 104 representing the input electric signal 106. Input terminal 102 may sometimes be referred to as an input port. In some embodiments, input terminal 102 may be an externally accessible pad or pin on an exterior of a semiconductor package for opto-isolator 100, although it is not a requirement that input terminal 102 be externally accessible. Although FIG. 1 depicts input terminal 102 without any connection other than light source 110, it should be appreciated that other connections to input terminal 102 within and/or external to opto-isolator 100 may be made to the input terminal 102. In some embodiments, input terminal 102 may be an internal connection point or a voltage node within opto-isolator 100. Input electric signal 106 may be a data signal and may be a voltage or a current signal. In some embodiments, light source 110 comprises a LED that emits an intensity-modulated light signal 104 based on a current or voltage waveform within the input electric signal 106.

Still referring to FIG. 1, which shows detector unit 120 configured to receive the light signal 104. Detector unit 120 may comprise one or more photodetectors that generate one or more photocurrents 128 in response to the light signal 104. Amplifier 124 is couple with detector unit 120 configured to generate the output electric signal 126 at the output terminal 122 based on the one or more photocurrents 128. In some embodiments, detector unit 120 comprises a pair of photodetectors configured to each generate photocurrents 128 that are 180° out of phase from each other, or of opposite signs or directions relative to a common reference direction in response to the light signal 104. In these embodiments, amplifier 124 is a differential amplifier that is configured to combine the two photocurrents 128 and to generate the output electric signal 126 at the output terminal 122 based on a difference between the two photocurrents 128. In the event of CMT, each of the two photodetectors within the detector unit 120 generates a transient current 108 of the same sign or direction in response to the transient voltage 107 across the isolation barrier 105. The respective transient current 108 is subtracted with each other when photocurrents 128 are combined differentially at the differential amplifier 124, such that an improved CMTI may be provided.

According to some aspects of the present application, CMTI may be measured by a maximum CMT voltage gradient (in units of kV/µs) an isolator system can withstand without erroneous output. In the embodiments shown in FIG. 1 and in each of the subsequently described embodiments, a CMTI of at least 30 kV/µs, at least 50 kV/µs, at least 100 kV/µs, at least 200 kV/µs, between 30 and 300 kV/µs, or between 50 and 200 kV/µs may be provided, given a CMI maximum amplitude of between 800 and 1000 V, for example at the transient voltage 107 as shown in FIG. 1.

Figure 2:
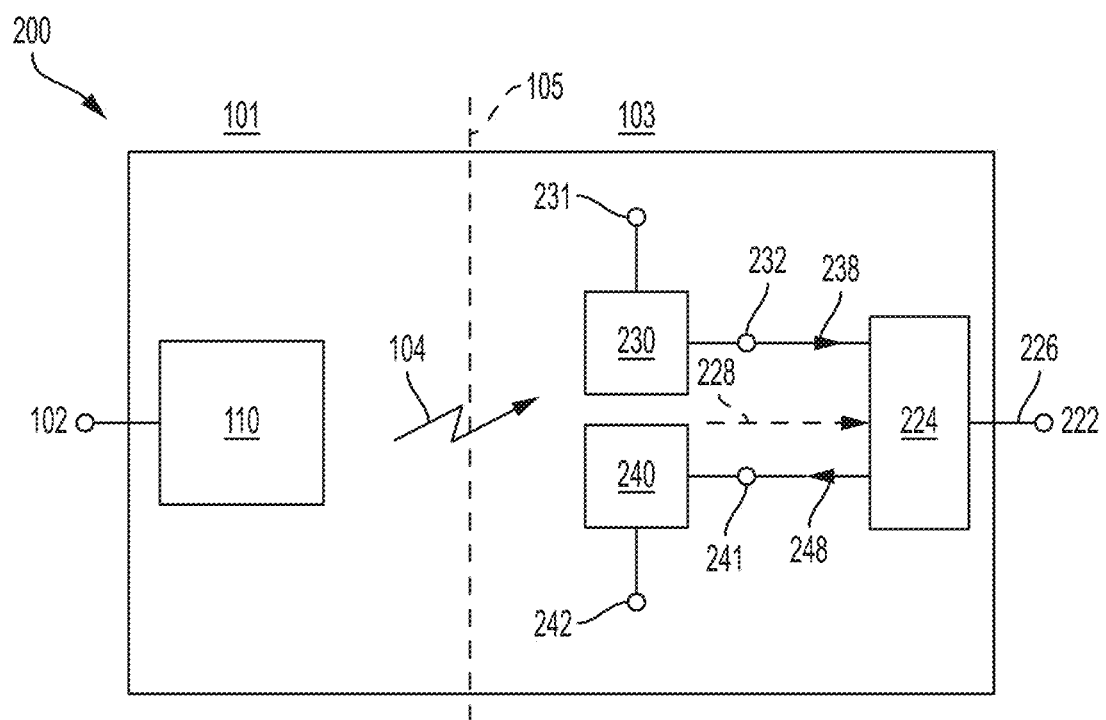
FIG. 2 is a high level block diagram of an opto-isolator 200, according to some embodiments of the present application.

FIG. 2 is a high level block diagram of an opto-isolator 200, according to some embodiments of the present application. Opto-isolator 200 includes several of the components of opto-isolator 100 of FIG. 1, but differs in that it includes a first photodetector 230 and a second photodetector 240 coupled to a differential amplifier circuitry 224.

In the opto-isolator 200 of FIG. 2, first photodetector 230 is configured to generate a first photocurrent 238 in response to light signal 104 that flows from a first node 231 towards a second node 232, and further into differential amplifier 224. Second photodetector 240 is configured to generate a second photocurrent 248 in response to light signal 104 that flows from a third node 241 towards a fourth node 242, and further into differential amplifier circuitry 224. As shown in FIG. 2, second node 238 of the first photodetector 230 and third node 241 of the second photodetector 240 are coupled to the differential amplifier circuitry 224, such that first photocurrent 238/second photocurrent 248 is configured to flow from second node 232/third node 241 in a direction into/out of the differential amplifier circuitry 224. First photocurrent 238 and second photocurrent 248 are configured to be along opposite directions when compared to a reference direction 228 that flows into differential amplifier circuitry 224. In other words, first photocurrent 238 flows into differential amplifier circuitry 224, while second photocurrent 248 flows out of differential amplifier circuitry 224. As photocurrent 238 flows in the same direction as reference direction 228, a numeric value of photocurrent 238 would have a positive polarity, whereas photocurrent 248 flows opposite the reference direction 228 and has a numeric value with a negative polarity, such that photocurrent 238 and 248 are of opposite signs, or may be regarded as 180° out of phase from each other.

Still referring to FIG. 2, differential amplifier circuitry 224 is coupled to the output terminal 222 and is configured to generate an output electric signal 226 at the output terminal 222 based on a difference between the first photocurrent 238 and the second photocurrent 248. For example, differential amplifier circuitry 224 may obtain the difference by subtracting second photocurrent 248 from first photocurrent 238. In some embodiments, differential amplifier circuitry 224 may comprise circuitry that performs selective scaling of amplitudes of each of the photocurrents 238 and 248, prior to subtracting, for example to account for a difference of detectivity or sensitivity between detectors 230 and 240 in response to light signal 104. Because photocurrents 238 and 248 are 180° out of phase from each other, or of opposite signs or directions relative to the reference direction 228, the difference between photocurrents 238 and 248 is effectively equal to a sum of first photocurrent 238 and a polarity-reversed second photocurrent 248, and is representative of the light signal 104. In the event of CMT, each of the two photodetectors 230 and 240 generates a transient current component that is superimposed on photocurrents 238 and 248 and is of the same sign or direction with each other, for example along the reference direction 228. The transient current components are therefore cancelled out from each other when differential amplifier circuitry 224 calculates the difference between photocurrents 238 and 248, such that an improved CMTI may be provided. In some embodiments, photodetectors 230 and 240 may be configured to have symmetrical transient response, that is, to generate transient currents with similar magnitude in response to a CMI, such that the transient currents are canceled or eliminated by the differential amplifier when calculating the difference between photocurrents 238 and 248. In some embodiments, symmetrical transient response may be provided by designing photodetectors 230 and 240 to have similar dimension and parasitic capacitive couplings with the input side 101 of the opto-isolator 200.

The opto-isolator 200 as shown in FIG. 2 may comprise a number of optoelectronic components that function as light source 110 and first and second photodetectors 230 and 240. In some embodiments, light source 110 may comprise one or more LEDs, or one or more laser diodes, or any other suitable light sources as the various aspects of the present application are not limited in this respect. Each of the first photodetector 230 and second photodetector 240 may comprise a photodiode, or a plurality of photodiodes in an array.

Figure 3:
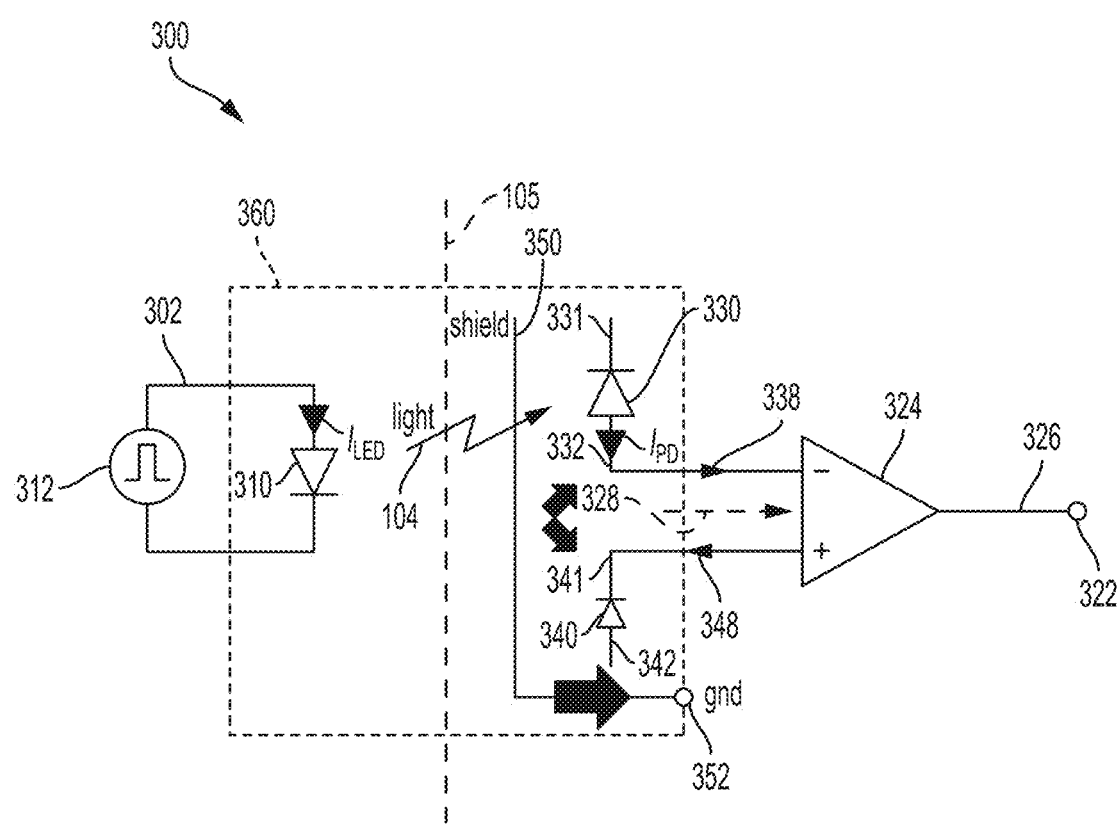
FIG. 3 is a schematic circuit diagram of an exemplary opto-isolator 300 representing a non-limiting implementation of the opto-isolator 200 of FIG. 2, according to an aspect of the present application.

FIG. 3 is a schematic circuit diagram of an exemplary opto-isolator 300 representing a non-limiting implementation of the opto-isolator 200 of FIG. 2. Opto-isolator 300 comprises an input source 312, an LED 310, first photodiode 330 coupled between first node 331 and second node 332, second photodiode 340 coupled between third node 341 and fourth node 342, differential amplifier circuitry 324, and optionally shield 350.

In the embodiment shown in FIG. 3, input source 312 is coupled to input terminal 302 to supply an input current signal $I_{LED}$ to drive LED 310 as a light source. According to some aspects, input current signal $I_{LED}$ may be generated by input source 312 to represent an input data stream. It should be appreciated that any suitable modulation technique may be used to generate input current signal $I_{LED}$ based on an input data stream, such as but not limited to amplitude modulation, frequency modulation, or on-off keying. Although LED 310 is driven by an input current signal, it should be appreciated that an embodiment of the present application is not limited to a current drive, and signal source 312 may alternatively be configured to generate an input voltage signal for driving LED 310.

In opto-isolator 300, LED 310 is configured to emit a light signal 104 in response to the input current signal $I_{LED}$. Light signal 104 is received by first and second photodiodes 330 and 340. The inventor has appreciated and recognized that first photodiode 330 may be configured to generate a first photocurrent 338 that flows in a direction into differential amplifier circuitry 324. In the embodiment shown in FIG. 3, a cathode of photodiode 330 is coupled to first node 331, while an anode of photodiode 330 is coupled to second node 332. According to an aspect of the present application, during operation of opto-isolator 300, a positive bias is applied between nodes 331 and 332, placing photodiode 330 in reverse-bias condition, such that no photocurrent or a relatively small amount of dark current is generated when no light is received by photodiode 330. When light signal 104 is received at photodiode 330, photocurrent 338 flows from first node 331 towards second node 332, and proceeds to flow in a direction into differential amplifier circuitry 324. Similarly, second photodiode 340 may be configured to generate a second photocurrent 348 that flows in a direction out of differential amplifier circuitry 324. In the embodiment shown in FIG. 3, a cathode of photodiode 340 is coupled to third node 341, while an anode of photodiode 340 is coupled to fourth node 342. According to an aspect of the present application, during operation of opto-isolator 300, a positive bias is applied between nodes 341 and 342, placing photodiode 340 in reverse-bias condition. When light signal 104 is received at photodiode 340, photocurrent 348 flows from third node 341 towards fourth node 342, and proceeds to flow in a direction out of differential amplifier circuitry 324.

Still referring to FIG. 3, differential amplifier circuitry 324 is coupled to the output terminal 322 and is configured to generate an output electric signal 326 at the output terminal 322 based on a difference between the first photocurrent 338 and the second photocurrent 348. Because photocurrents 338 and 348 are substantially 180° out of phase from each other, or of opposite signs or directions relative to the reference direction 328, the difference between photocurrents 338 and 348 is effectively equal to a sum of first photocurrent 338 and a polarity-reversed second photocurrent 348, and is representative of the light signal 104. In the event of CMT, each of the two photodiodes 330 and 340 generates a transient current that is superimposed with photocurrents 238 and 248 and is the same sign or direction with each other, for example along the reference direction 228. The transient current components are therefore cancelled out from each other when differential amplifier circuitry 224 calculates the difference between photocurrents 238 and 248, such that an improved CMTI may be provided. In some embodiments, symmetrical transient response may be provided by designing photodiodes 330 and 340 to have similar dimension and parasitic capacitive couplings across the isolation barrier 105, to generate transient currents with similar magnitude in response to a CMI, such that the transient currents are canceled or eliminated by the differential amplifier when calculating the difference between photocurrents 338 and 348. In some embodiments, photodiodes 330 and 340 also provide symmetrical photodetector gain, such that each photodiode generates a photocurrent of the same amplitude in response to light signal 104. Thus, the difference between photocurrents 338 and 348 as seen by differential amplifier circuitry 324 is effectively twice the amplitude of each of the photocurrents 338 and 348. Having symmetrical photodetector gain from the two photodiodes may allow differential amplifier to provide similar amplifier gain to photocurrents 338 and 348, which can simplify circuit design for the differential amplifier circuitry 324, and improve the dynamic range of opto-isolator 300. It should be appreciated that symmetrical transient response and symmetrical photodetector gain in the first and second photodiodes are only one aspect of the present application, and not a requirement. For example, the discussion below with respect to FIG. 4 will provide an embodiment that may accommodate photodiodes with different transient response.

Still referring to FIG. 3, in some embodiments, LED 310 and photodetectors 330, 340 are co-packaged in a housing 360. In one embodiment, the two photodetectors 330, 340 are monolithically integrated on a substrate, as will be discussed in more detail in relation to FIGS. 6-8 below.

As shown in FIG. 3, opto-isolator 300 may optionally include a shield 350 between LED 310 and photodetectors 330 and 340. Shield 350 comprises a transparent conductive material that is configured to be substantially transparent to light signal 104, for example at least 80%, or at least 90% transparent to light signal 104. In some embodiments, shield 350 may comprise a transparent metal, or a conductive oxide. Shield 350 may be coupled to a reference voltage to reduce capacitive coupling between LED 310 and photodiodes 330 and 340. In a non-limiting example, shield 350 is coupled to a common reference voltage level 352. In some embodiments, common reference voltage level 352 is circuit ground. Shield 350 may allow further improvement to CMTI performance of opto-isolator 300, although it should be appreciated that shield 350 is not a requirement and in some embodiments, no shield is provided to simplify circuit design and reduce cost.

Figure 4:
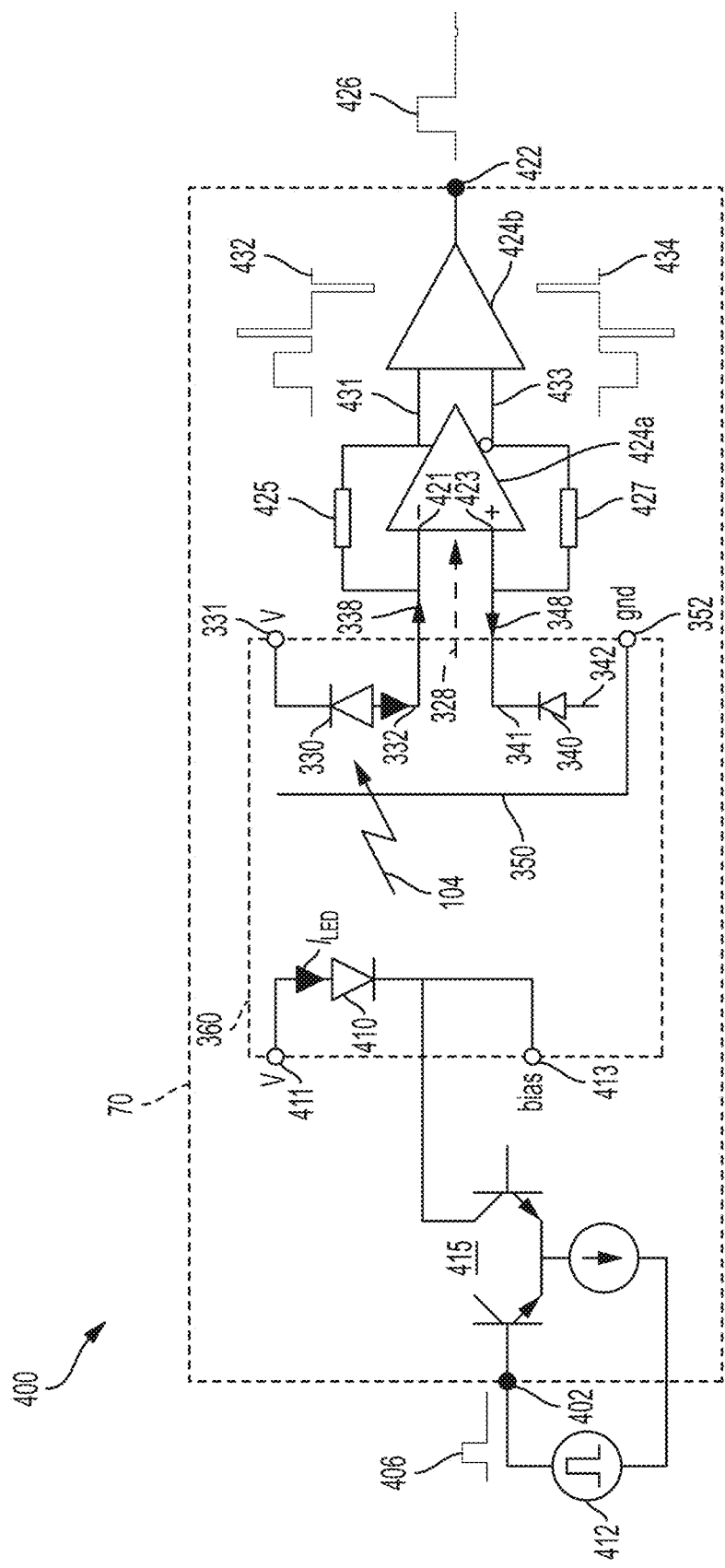
FIG. 4 is a schematic circuit diagram of an exemplary opto-isolator 400 representing another non-limiting implementation of the opto-isolator 200 of FIG. 2, according to an aspect of the present application.

FIG. 4 is a schematic circuit diagram of an exemplary opto-isolator 400 representing another non-limiting implementation of the opto-isolator 200 of FIG. 2. Opto-isolator 400 includes several of the components of opto-isolator 300 of FIG. 3, but differs in that it includes an input source 412, an LED 410, input driver 415, transimpedance amplifier (TIA) 424a with impedances 425, 427, differential amplifier 424b, and a package 370.

In opto-isolator 400, a first input 421 of TIA 424a is coupled to the anode of first photodiode 330 via the second node 332. Impedance 425 of TIA 424a is configured to convert photocurrent 338 from first photodiode 330, flowing in a direction into the TIA 424a, into a voltage signal 432 at first amplifier voltage node 431. A second input 423 of TIA 424a is coupled to the cathode of second photodiode 340 via third node 341. Impedance 427 of TIA 424a is configured to convert photocurrent 348 from second photodiode 340, flowing in a direction opposite photocurrent 338 and out of the TIA 424a, into a voltage signal 434 at second amplifier voltage node 433. As photocurrents 338 and 348 are 180° out of phase from each other, first amplifier voltage signal 432 and second amplifier voltage signal 434 are voltage signals that are 180° out of phase from each other as shown in FIG. 4.

Still referring to FIG. 4, impedance 425 and 427 may be used in TIA 424a to adjust a transimpedance amplification gain to convert respective photocurrents 338 and 348 into voltage signals with an amplified amplitude. A different transimpedance amplification gain may accommodate or compensate for asymmetrical transient responses between the first and second photodiodes 330, 340. For example, if first photodiode 330 has a higher transient response due to higher capacitive coupling with components across the isolation barrier compared to second photodiode 340, first photodiode 330 would generate a relatively high common mode transient noise current at the first input 421 of TIA 424a in response to a transient voltage across the isolation barrier. At the same time second photodiode 340 would generate a lower common mode transient noise current at the second input 423 of TIA 424a in response to the same transient voltage. According to an aspect of the present application, impedance 425 may be selected to have a value smaller than impedance 427, to provide a lower transimpedance gain at the first input 421 to compensate for the higher common mode transient noise current, such that the amplitude for common mode transient noise current after the TIA 424a would be essentially the same at first and second amplifier voltage nodes 431 and 433, and can be suppressed after subtraction. Differential amplifier 424b is coupled with first and second amplifier voltage nodes 431 and 433, and is configured to generate an output voltage signal 426 at output terminal 422 based on a difference between amplifier voltage signals 432 and 434. According to some aspects, TIA 424a and differential amplifier 424b together may form part of a differential amplifier circuitry of the type as described in relation to FIG. 3.

As shown in FIG. 4, LED 410 is coupled to voltage nodes 411 and 413 and is driven by input driver 415 to emit light signal 104 in response to an input voltage signal 406 generated by input source 412 at input terminal 402. In some embodiments, components such as LED 410, photodiodes 330 and 340 and optionally shield 350 may be co-packaged in a housing 360. In some embodiments, opto-isolator 400 as shown in FIG. 4 comprises a package 470 where housing 360, TIA 424a and differential amplifier 424b are disposed.

Figure 5:
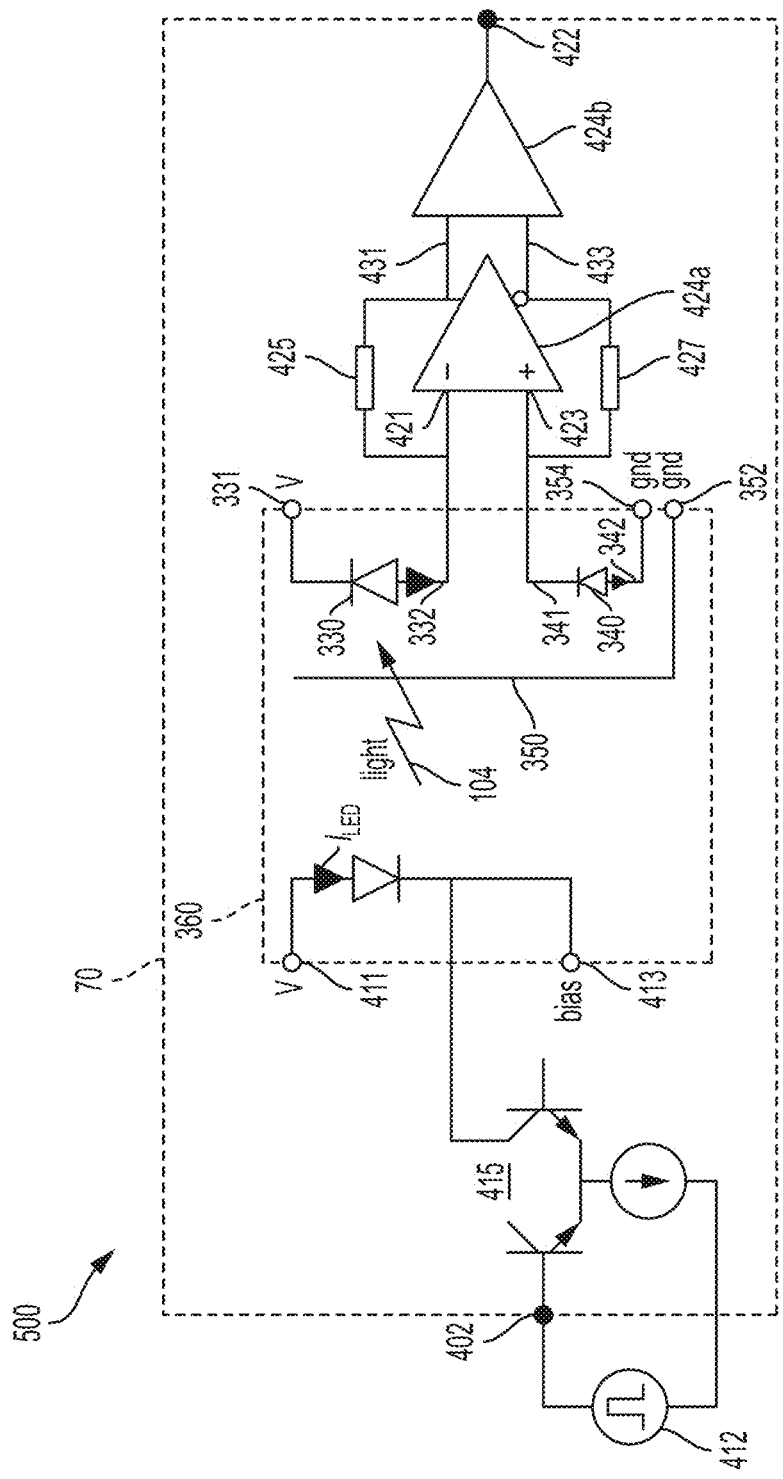
FIG. 5 is a schematic circuit diagram of an exemplary opto-isolator 500 representing yet another non-limiting implementation of the opto-isolator 200 of FIG. 2, according to an aspect of the present application.

FIG. 5 is a schematic circuit diagram of an exemplary opto-isolator 500 representing yet another non-limiting implementation of the opto-isolator 200 of FIG. 2. Opto-isolator 500 includes similar components of opto-isolator 400 of FIG. 4, but differs in that the fourth node 342, coupled to the anode of the second photodiode 340, is connected to a common reference voltage level 354. In some embodiments, common reference voltage level 354 is circuit ground.

Figure 6:
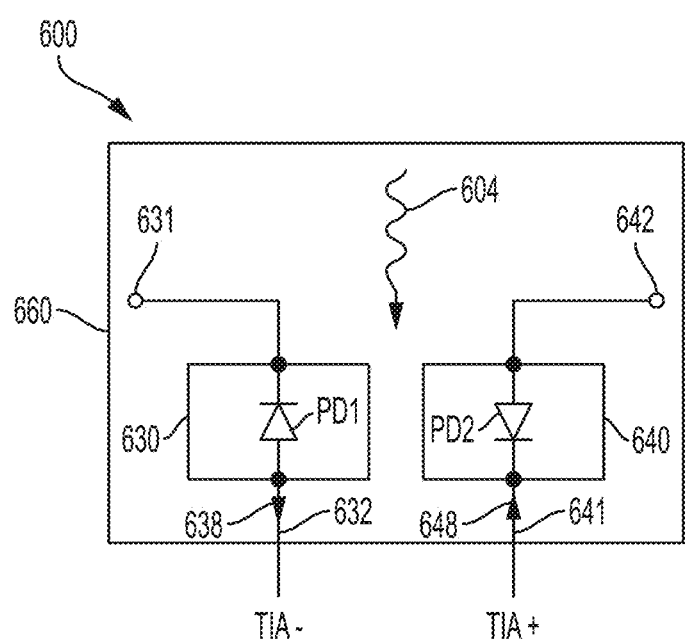
FIG. 6 is a schematic top view diagram of an exemplary detector unit 600 representing a non-limiting implementation of the detector unit 120 of opto-isolator 100 of FIG. 1, according to some embodiments of the present application.

FIG. 6 is a schematic top view diagram of an exemplary detector unit 600 representing a non-limiting implementation of the detector unit 120 of opto-isolator 100 of FIG. 1, according to some embodiments of the present application. Detector unit 600 is part of opto-isolator 100 and includes a substrate 660, a first photodiode 630, and a second photodiode 640. While not shown, a light source in the same opto-isolator is configured to emit a light signal 604 in a direction perpendicular to a top surface of substrate 660. Photodiodes 630 and 640 are configured to receive light signal 604, and are similar in some respects to photodiodes 330 and 340 shown in FIG. 3. Specifically, first photodiode 630 is configured to generate a first photocurrent 638 that flows in a direction into a differential amplifier circuitry (not shown) via TIA−. A cathode of photodiode 630 is coupled to first node 631, while an anode of photodiode 630 is coupled to second node 632. According to an aspect of the present application, during operation, a positive bias is applied between nodes 631 and 632, placing photodiode 630 in reverse-bias condition, such that no photocurrent or a relatively small amount of dark current is generated when no light is received by photodiode 630. When light signal 604 is received at photodiode 630, photocurrent 638 flows from first node 631 towards second node 632, and proceeds to flow in a direction into TIA−. Similarly, second photodiode 640 may be configured to generate a second photocurrent 648 that flows in a direction out of TIA+. A cathode of photodiode 640 is coupled to third node 641, while an anode of photodiode 640 is coupled to fourth node 642. According to an aspect of the present application, during operation, a positive bias is applied between nodes 641 and 642, placing photodiode 640 in reverse-bias condition. When light signal 604 is received at photodiode 640, photocurrent 648 flows from third node 641 towards fourth node 642, and proceeds to flow in a direction out of TIA+.

Substrate 660 as shown in FIG. 6 may be any suitable semiconductor substrate and may be of a single semiconductor material composition, or may be a composite comprising multiple layers and or patterns of semiconductor materials. In some embodiments, first and second photodiodes 630 and 640 are disposed on the top surface of substrate 660 facing the light source. Although it should be appreciated that it is not a requirement that photodetectors 630 and 640 face the light source. For example, light signal 604 may be guided by reflectors and/or waveguides to be transmitted laterally parallel to the surface of the wafer 660, such that a light source and photodetectors may be coplanar within substrate 660. In one example, substrate 660 may comprise a portion of a silicon wafer, and photodiodes 630 and 640 may be fabricated on the top surface of the silicon wafer 660 facing the light source and light signal 604.

Figure 7:
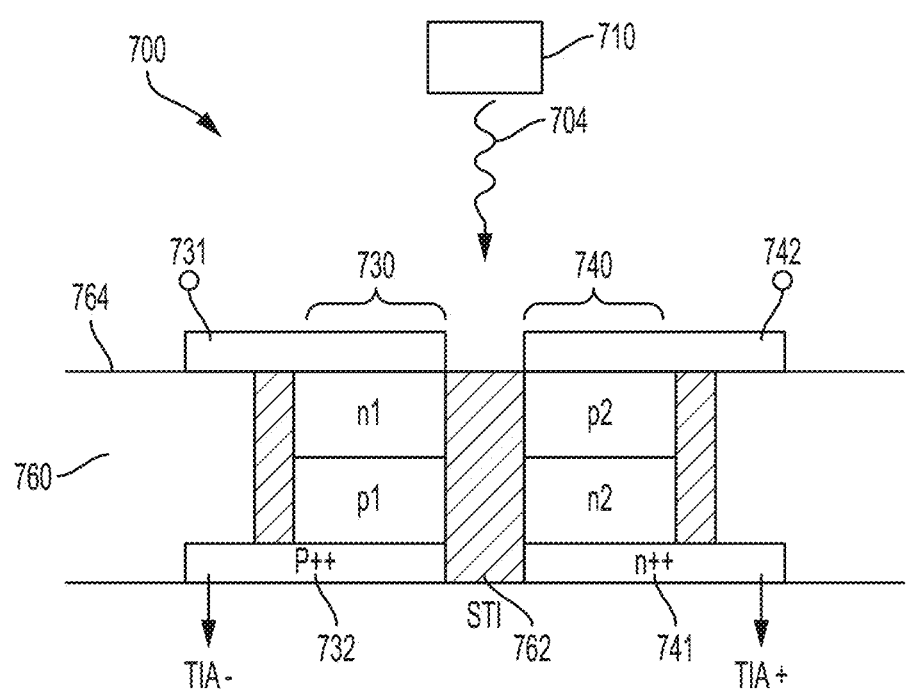
FIG. 7 is a schematic cross-sectional view diagram of an exemplary detector unit 700 representing a non-limiting implementation of the detector unit 600 of FIG. 6, according to some embodiments of the present application.

FIG. 7 is a schematic cross-sectional view diagram of an exemplary detector unit 700 representing a non-limiting implementation of the detector unit 600 of FIG. 6, according to some embodiments of the present application. FIG. 7 shows first photodiode 730 and second photodiode 740 disposed on a surface 764 of substrate 760 facing light source 710. First photodiode 730 comprises a vertical p-n junction between regions n1 and p1, with cathode 731 and anode 732. Cathode 731 may be connected to a first node configured to apply a bias voltage relative to anode 732. Anode 732 may be connected to a second node configured to be coupled to an input TIA− of a TIA. Second photodiode 740 comprises a vertical p-n junction between regions n2 and p2, with anode 742 and cathode 741. Cathode 741 may be connected to a third node configured to be coupled to an input TIA+ of a TIA. Anode 742 may be connected to a fourth node configured to apply a bias voltage relative to anode 742. Substrate 760 may comprise dielectric regions 762 to electrically isolate photodetectors 730, 740 between each other and other elements that may be present within substrate 760.

Figure 8:
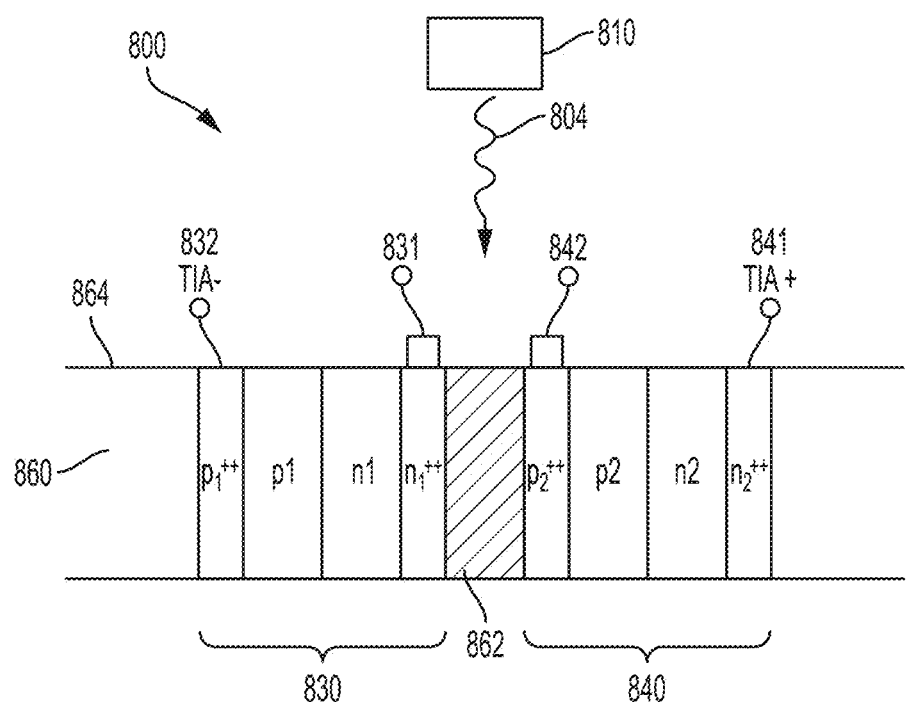
FIG. 8 is a schematic cross-sectional view diagram of an exemplary detector unit 800 representing a non-limiting implementation of the detector unit 600 of FIG. 6, according to some embodiments of the present application.

FIG. 8 is a schematic cross-sectional view diagram of an exemplary detector unit 800 representing a non-limiting implementation of the detector unit 600 of FIG. 6, according to some embodiments of the present application. FIG. 8 shows first photodiode 830 and second photodiode 840 disposed on a surface 864 of substrate 860 facing light source 810. First photodiode 830 comprises a lateral p-n junction between regions n1 and p1, with cathode 831 and anode 832. Cathode 831 may be connected to a first node configured to apply a bias voltage relative to anode 832. Anode 832 may be connected to a second node configured to be coupled to an input TIA− of a TIA. Second photodiode 840 comprises a lateral p-n junction between regions n2 and p2, with anode 842 and cathode 841. Cathode 841 may be connected to a third node configured to be coupled to an input TIA+ of a TIA. Anode 842 may be connected to a fourth node configured to apply a bias voltage relative to anode 842. Substrate 860 may comprise dielectric regions 862 to electrically isolate photodetectors 830, 840 between each other and other elements that may be present within substrate 860.

FIG. 9A is a schematic top view diagram of an exemplary detector unit 900A representing a non-limiting implementation of the detector unit 120 of FIG. 1, according to some embodiments of the present application. FIG. 9A shows that a plurality of first photodetectors PD and second photodetectors D are arranged in a grid-like two-dimensional array. The photodetectors shown in FIG. 9A are disposed on a surface of a substrate facing a light source (not shown) in a opto-isolator. Providing an array of photodetectors has the advantage of increasing the photo detection area in an opto-isolator, and increasing signal-to-noise ratio. Each of the first photodetectors PD may be coupled to an input of a TIA in similar fashions as discussed above in relation to FIG. 4, with the same or customizable transimpedance gains for photocurrents generated at each PD, or a group of first photodetectors PD may be connected in parallel to increase their effective photo-sensing area, while connected to an input of the same TIA. Similarly in FIG. 4, second photodetectors D may be connected to a TIA in groups of parallel photodetectors D, or individually. Although FIG. 9A illustrates first and second photodetectors PD and D in an alternating pattern along both the row and column directions, it should be appreciated that such arrangement is by way of example only and aspects of the present application is not limited to any specific pattern of arrangement.

FIG. 9B is a schematic top view diagram of an exemplary detector unit 900B representing a non-limiting implementation of the detector unit 120 of FIG. 1, according to some embodiments of the present application. Detector unit 900B is similar to detector unit 900A of FIG. 9A in several aspects and includes a plurality of first photodetectors PD and second photodetectors D arranged in a two-dimensional array. Detector unit 900B differs from detector unit 900A of FIG. 9A in that the photodetectors are arranged in a radial array. Any suitable pattern arrangement of the first and second photodetectors PD and D may be used in detector unit 900B.

FIG. 9C is a schematic top view diagram of an exemplary detector unit 900C representing a non-limiting implementation of the detector unit 120 of FIG. 1, according to some embodiments of the present application. Detector unit 900C is similar to detector unit 900A of FIG. 9A in several aspects and includes a plurality of first photodetectors PD and second photodetectors D arranged in a two-dimensional array. Detector unit 900C differs from detector unit 900A of FIG. 9A in that the photodetectors are arranged in a concentric array. While the photodetectors arranged farther away from the center of detector unit 900C of FIG. 9C have larger surface area and may have a larger capacitive coupling and transient response compared to photodetectors closer to the center, it should be appreciated that difference in transient responses between the first photodetector and second photodetector may be compensated by adjusting their respective transimpedance gain at a TIA coupled to the photodetectors, such that common mode transient noise in each of the photodetectors in detector unit 900C may be cancelled out, as discussed above in relation to FIG. 4. Any suitable pattern arrangement of the first and second photodetectors PD and D may be used in detector unit 900C.

FIG. 9D is a schematic top view diagram of an exemplary detector unit 900D representing a non-limiting implementation of the detector unit 120 of FIG. 1, according to some embodiments of the present application. Detector unit 900C is similar to detector unit 900C of FIG. 9C in several aspects and includes a plurality of first photodetectors PD and second photodetectors D arranged in a two-dimensional array. Detector unit 900D differs from detector unit 900C in that the photodetectors are arranged in a gridded array in both concentric sections and radial sections. Any suitable pattern arrangement of the first and second photodetectors PD and D may be used in detector unit 900C. It should also be appreciated that it is not a requirement for photodetectors in each concentric section to align radially with those in adjacent concentric sections, and that there may be different number of photodetectors in each concentric section.

Figure 10:
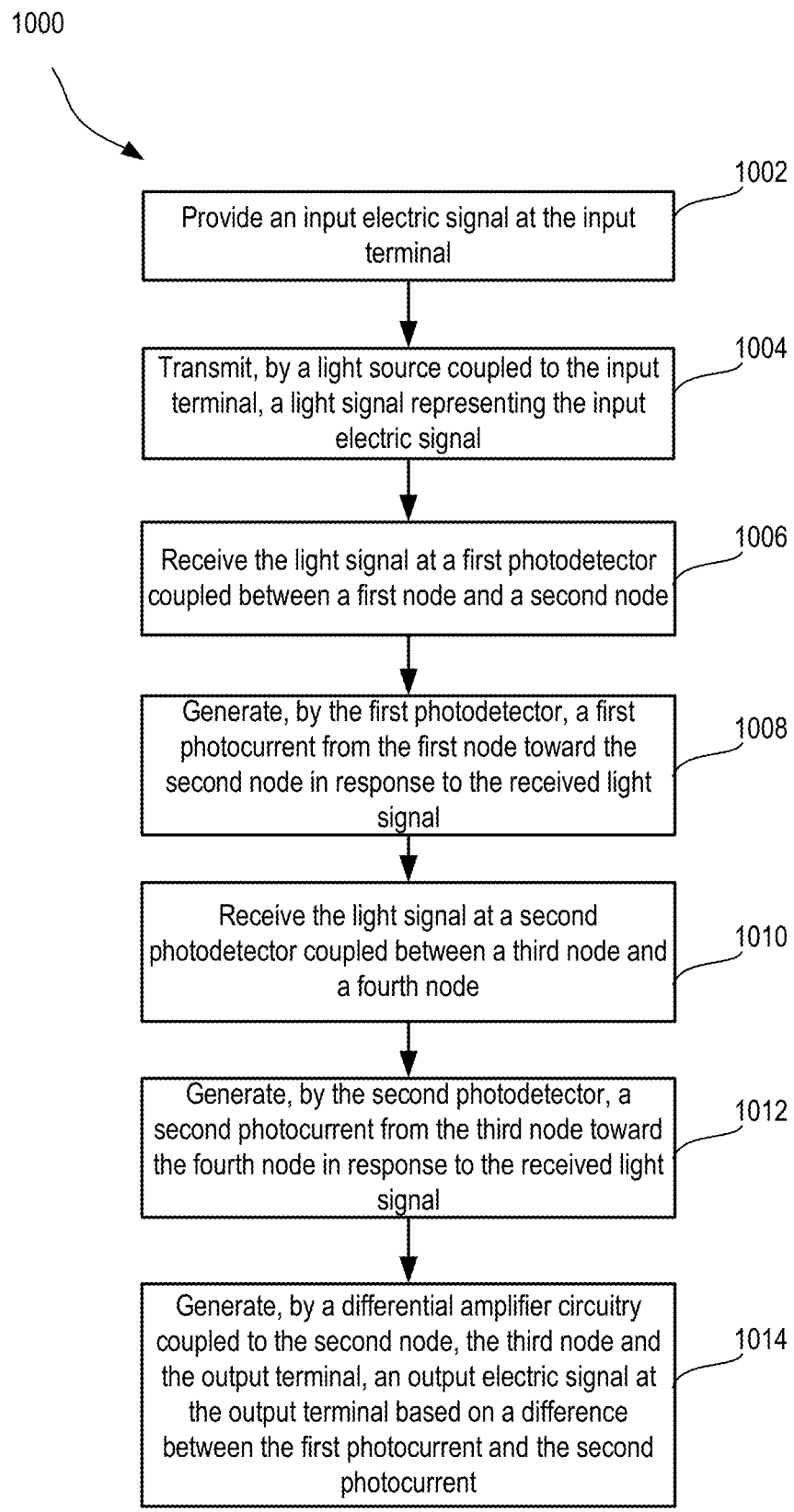
FIG. 10 is a schematic flow diagram of an exemplary method 1000, according to some embodiments of the present application.

FIG. 10 is a schematic flow diagram of an exemplary method 1000, according to some embodiments of the present application. Method 1000 is a method for operating an isolator having an input terminal and an output terminal electrically isolated from the input terminal. As shown in FIG. 10, at act 1002, method 1000 comprises providing an input electric signal at the input terminal. At act 1004, method 1000 comprises transmitting, by a light source coupled to the input terminal, a light signal representing the input electric signal. At act 1006, method 1000 comprises receiving the light signal at a first photodetector coupled between a first node and a second node. At act 1008, method 1000 comprises generating, by the first photodetector, a first photocurrent from the first node toward the second node in response to the received light signal. At act 1010, method 1000 comprises receiving the light signal at a second photodetector coupled between a third node and a fourth node. At act 1012, method 1000 comprises generating, by the second photodetector, a second photocurrent from the third node toward the fourth node in response to the received light signal. At act 1014, method 1000 comprises generating, by a differential amplifier circuitry coupled to the second node, the third node and the output terminal, an output electric signal at the output terminal based on a difference between the first photocurrent and the second photocurrent.

The technology described herein may be used in various settings, including those in which isolators are used. For example, automotive, industrial, and healthcare applications may all make use of the technology described herein.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. An isolator, comprising:
   an input terminal and an output terminal electrically isolated from the input terminal;
   a light source coupled to the input terminal and configured to transmit a light signal representing an input electric signal at the input terminal;
   a first photodetector coupled between a first node and a second node, the first photodetector configured to receive the light signal and generate a first photocurrent from the first node toward the second node in response to the light signal;
   a second photodetector coupled between a third node and a fourth node, the second photodetector configured to receive the light signal and generate a second photocurrent from the third node toward the fourth node in response to the light signal; and
   differential amplifier circuitry coupled to the second node, the third node and the output terminal, wherein the differential amplifier circuitry is configured to generate an output electric signal at the output terminal based on a difference between the first photocurrent and the second photocurrent.

2. The isolator of claim 1, further comprising a semiconductor substrate, wherein:
   the first photodetector and the second photodetector are disposed on a surface of the semiconductor substrate facing the light source.

3. The isolator of claim 2, further comprising a shield between the light source and the first and second photodetectors.

4. The isolator of claim 3, further comprising a housing, wherein the shield and the semiconductor substrate are packaged in the housing.

5. The isolator of claim 1, wherein the light source is a light emitting diode (LED) or a laser diode.

6. The isolator of claim 1, wherein the first photodetector is a first photodiode and the second photodetector is a second photodiode, the second node is an anode of the first photodiode, the third node is a cathode of the second photodiode, and wherein the first photocurrent flows into the differential amplifier circuitry, and the second photocurrent flows out of the differential amplifier circuitry.

7. The isolator of claim 1, wherein the differential amplifier circuitry comprises a trans-impedance amplifier (TIA) coupled to the second and third nodes, the TIA configured to generate a first amplifier voltage signal at a first amplifier voltage node based on the first photocurrent, and a second amplifier voltage signal at a second amplifier voltage node based on the second photocurrent.

8. The isolator of claim 7, wherein the differential amplifier circuitry further comprises a differential amplifier coupled to the first and second amplifier voltage nodes and the output terminal, the differential amplifier circuitry configured to generate the output electric signal at the output terminal based on a difference between the first and second amplifier voltage signals.

9. A semiconductor package, comprising:
a semiconductor substrate comprising a first photodetector and a second photodetector disposed on a first surface of the semiconductor substrate;
an input terminal and an output terminal electrically isolated from the input terminal;
a light source coupled to the input terminal and configured to transmit a light signal representing an input electric signal at the input terminal, wherein the first photodetector is coupled between a first node and a second node, and is configured to receive the light signal and generate a first photocurrent from the first node toward the second node in response to the light signal, and wherein the second photodetector is coupled between a third node and a fourth node, and configured to receive the light signal and generate a second photocurrent from the third node toward the fourth node in response to the light signal; and
differential amplifier circuitry coupled to the second node, the third node and the output terminal, wherein the differential amplifier circuitry is configured to generate an output electric signal at the output terminal based on a difference between the first photocurrent and the second photocurrent.

10. The semiconductor package of claim 9, wherein the light source is a light emitting diode (LED) or a laser diode.

11. The semiconductor package of claim 9, wherein the first photodetector is a first photodiode and the second photodetector is a second photodiode, the second node is an anode of the first photodiode, the third node is a cathode of the second photodiode, and wherein the first photocurrent flows into the differential amplifier circuitry, and the second photocurrent flows out of the differential amplifier circuitry.

12. The semiconductor package of claim 9, further comprising a housing, and a shield between the light source and the first and second photodetectors, wherein the shield and the semiconductor substrate are packaged in the housing.

13. The semiconductor package of claim 9, wherein the differential amplifier circuitry comprises a trans-impedance amplifier (TIA) coupled to the second and third nodes, the TIA configured to generate a first amplifier voltage signal at a first amplifier voltage node based on the first photocurrent, and a second amplifier voltage signal at a second amplifier voltage node based on the second photocurrent.

14. The semiconductor package of claim 13, wherein the differential amplifier circuitry further comprises a differential amplifier coupled to the first and second amplifier voltage nodes and the output terminal, the differential amplifier circuitry configured to generate the output electric signal at the output terminal based on a difference between the first and second amplifier voltage signals.

15. The semiconductor package of claim 9, wherein the first photodetector is a photodetector of a first array of photodetectors, the second photodetector is a photodetector of a second array of photodetectors, wherein:
the first and second arrays of photodetectors are arranged in a two-dimensional array on the first surface, wherein the two-dimensional array is selected from the group consisting of a grid array, a radial array, and a concentric array.

16. The semiconductor package of claim 9, wherein the first surface of the semiconductor substrate faces the light source.

17. The semiconductor package of claim 16, wherein each of the first and second photodetectors comprises a lateral p-n junction parallel to the first surface, or a vertical p-n junction perpendicular to the first surface.

18. A method for operating an isolator having an input terminal and an output terminal electrically isolated from the input terminal, the method comprising:
providing an input electric signal at the input terminal;
transmitting, by a light source coupled to the input terminal, a light signal representing the input electric signal;
receiving the light signal at a first photodetector coupled between a first node and a second node;
generating, by the first photodetector, a first photocurrent from the first node toward the second node in response to the received light signal;
receiving the light signal at a second photodetector coupled between a third node and a fourth node;
generating, by the second photodetector, a second photocurrent from the third node toward the fourth node in response to the received light signal;
generating, by differential amplifier circuitry coupled to the second node, the third node and the output terminal, an output electric signal at the output terminal based on a difference between the first photocurrent and the second photocurrent.

19. The method of claim 18, wherein the first photodetector is a first photodiode and the second photodetector is a second photodiode, the second node is an anode of the first photodiode, the third node is a cathode of the second photodiode, and wherein
generating the first photocurrent and the second photocurrent comprises generating the first photocurrent to flow into the differential amplifier circuitry, and generating the second photocurrent to flow out of the differential amplifier circuitry.

20. The method of claim 18, wherein the differential amplifier circuitry comprises a trans-impedance amplifier (TIA) coupled to the second and third nodes, wherein
generating the output electric signal comprises generating, by the TIA, a first amplifier voltage signal at a first amplifier voltage node based on the first photocurrent, and a second amplifier voltage signal at a second amplifier voltage node based on the second photocurrent.

* * * * *